(12) United States Patent
Hirayama et al.

(10) Patent No.: US 9,190,136 B2
(45) Date of Patent: Nov. 17, 2015

(54) FERROELECTRIC MEMORY DEVICE

(71) Applicant: FUJITSU SEMICONDUCTOR LIMITED, Yokohama-shi, Kanagawa (JP)

(72) Inventors: Tomohisa Hirayama, Kawasaki (JP); Keizo Morita, Sagamihara (JP); Naoharu Shinozaki, Fuchu (JP)

(73) Assignee: FUJITSU SEMICONDUCTOR LIMITED, Yokohama (JP)

(*) Notice: Subject to any disclaimer, the term of this patent is extended or adjusted under 35 U.S.C. 154(b) by 0 days.

(21) Appl. No.: 14/485,494

(22) Filed: Sep. 12, 2014

(65) Prior Publication Data

US 2015/0098263 A1    Apr. 9, 2015

(30) Foreign Application Priority Data

Oct. 3, 2013   (JP) ................. 2013-208503

(51) Int. Cl.

| | | |
|---|---|---|
| G11C 11/22 | (2006.01) | |
| G11C 5/06 | (2006.01) | |
| G06F 11/10 | (2006.01) | |
| G06F 11/07 | (2006.01) | |
| G06F 11/08 | (2006.01) | |
| G06F 11/00 | (2006.01) | |
| G06F 12/00 | (2006.01) | |
| H03M 13/11 | (2006.01) | |
| G11C 11/56 | (2006.01) | |
| H03M 13/09 | (2006.01) | |
| H03M 13/19 | (2006.01) | |

(52) U.S. Cl.
CPC .......... *G11C 11/2275* (2013.01); *G11C 11/221* (2013.01); *G11C 11/22* (2013.01); *G11C 11/5657* (2013.01); *H03M 13/09* (2013.01); *H03M 13/118* (2013.01); *H03M 13/1148* (2013.01); *H03M 13/19* (2013.01)

(58) Field of Classification Search
CPC ............... G11C 11/22; G11C 11/2275; G11C 11/5657; H03M 13/19; H03M 13/09; H03M 13/118; H03M 13/1148
USPC ............ 365/65, 145, 200; 714/777, 800, 801, 714/802
See application file for complete search history.

(56) References Cited

U.S. PATENT DOCUMENTS

| | | | |
|---|---|---|---|
| 6,978,343 B1 * | 12/2005 | Ichiriu | ........................ 711/108 |
| 7,123,501 B2 | 10/2006 | Noda | |
| 7,278,085 B1 * | 10/2007 | Weng et al. | ................... 714/766 |
| 7,765,455 B2 | 7/2010 | Hoya et al. | |

(Continued)

FOREIGN PATENT DOCUMENTS

| | | |
|---|---|---|
| JP | 2004-227686 A | 8/2004 |
| JP | 2005-135488 A | 5/2005 |
| JP | 2007-080343 A | 3/2007 |

(Continued)

*Primary Examiner* — Ly D Pham
(74) *Attorney, Agent, or Firm* — Arent Fox LLP

(57) ABSTRACT

A ferroelectric memory device includes a memory array including a plurality of ferroelectric memory cells, a code generating circuit configured to multiply write data and a parity generator matrix to generate check bits, thereby producing a Hamming code having information bits and the check bits arranged therein, the information bits being the write data, and a driver circuit configured to write the Hamming code to the memory array, wherein the parity generator matrix has a plurality of rows, and a number of "1"s in each of the rows is an even number.

8 Claims, 18 Drawing Sheets

(56) References Cited

U.S. PATENT DOCUMENTS

| | | |
|---|---|---|
| 7,898,853 B2 | 3/2011 | Lee et al. |
| 8,972,835 B1 * | 3/2015 | Rahul et al. ............ 714/800 |
| 2005/0149833 A1 * | 7/2005 | Worley et al. .......... 714/781 |
| 2008/0082869 A1 * | 4/2008 | Sugawara ............... 714/702 |

FOREIGN PATENT DOCUMENTS

| | | |
|---|---|---|
| JP | 2009-064440 A | 3/2009 |

* cited by examiner

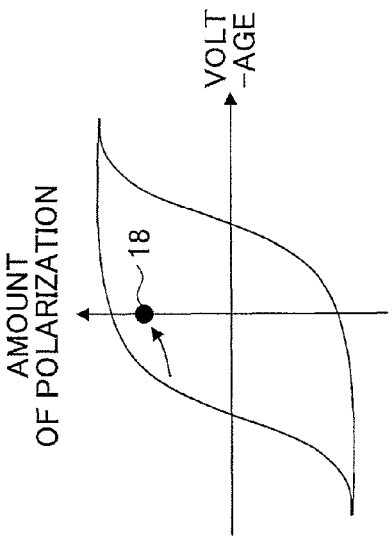
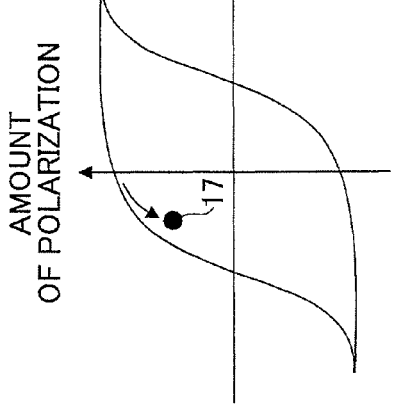
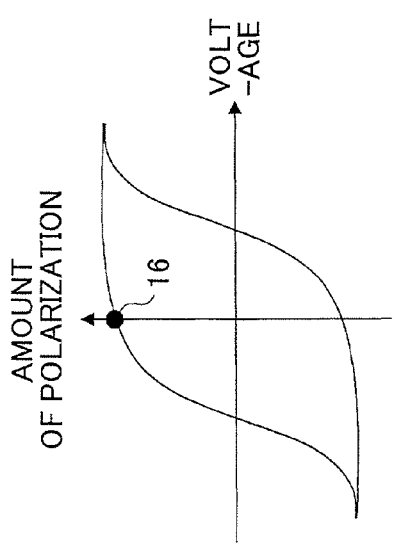

FIG.6A

| | D00 | D01 | D02 | D03 | D04 | D05 | D06 | D07 | D08 | D09 | D10 | D11 | D12 | D13 | D14 | D15 |
|---|---|---|---|---|---|---|---|---|---|---|---|---|---|---|---|---|
| P0 | 1 | 1 | 0 | 1 | 1 | 0 | 1 | 1 | 1 | 0 | 1 | 1 | 0 | 1 | 0 | 1 |
| P1 | 1 | 0 | 1 | 1 | 0 | 1 | 1 | 0 | 0 | 1 | 1 | 0 | 1 | 1 | 0 | 0 |
| P2 | 0 | 1 | 1 | 1 | 0 | 0 | 0 | 1 | 1 | 1 | 1 | 0 | 0 | 0 | 1 | 1 |
| P3 | 0 | 0 | 0 | 0 | 1 | 1 | 1 | 1 | 1 | 1 | 0 | 0 | 0 | 0 | 0 | 0 |
| P4 | 0 | 0 | 0 | 0 | 0 | 0 | 0 | 0 | 0 | 0 | 0 | 1 | 1 | 1 | 1 | 1 |

FIG.6B

| | D00 | D01 | D02 | D03 | D04 | D05 | D06 | D07 | D08 | D09 | D10 | D11 | D12 | D13 | D14 | D15 |
|---|---|---|---|---|---|---|---|---|---|---|---|---|---|---|---|---|
| P0 | 1 | 1 | 0 | 1 | 1 | 0 | 1 | 1 | 1 | 0 | 1 | 1 | 0 | 1 | 0 | 1 |
| P1 | 1 | 0 | 1 | 1 | 0 | 1 | 1 | 0 | 0 | 1 | 0 | 1 | 1 | 0 | 0 | 0 |
| P2 | 0 | 1 | 1 | 1 | 0 | 0 | 0 | 1 | 1 | 1 | 0 | 0 | 0 | 0 | 1 | 1 |
| P3 | 0 | 0 | 0 | 0 | 1 | 1 | 1 | 0 | 0 | 0 | 1 | 1 | 1 | 0 | 0 | 0 |
| P4 | 0 | 0 | 0 | 0 | 0 | 0 | 0 | 0 | 0 | 0 | 0 | 0 | 0 | 1 | 1 | 1 |

FIG.8

|  | D00 | D01 | D02 | D03 | D04 | D05 | D06 | D07 | D08 | D09 | D10 | D11 | D12 | D13 | D14 | D15 | P00 | P01 | P02 | P03 | P04 |
|---|---|---|---|---|---|---|---|---|---|---|---|---|---|---|---|---|---|---|---|---|---|
| S0 | 1 | 1 | 0 | 1 | 1 | 0 | 1 | 0 | 1 | 0 | 1 | 1 | 0 | 1 | 0 | 1 | 1 | 0 | 0 | 0 | 0 |
| S1 | 1 | 0 | 1 | 1 | 0 | 1 | 1 | 0 | 0 | 1 | 0 | 1 | 1 | 0 | 0 | 0 | 0 | 1 | 0 | 0 | 0 |
| S2 | 0 | 1 | 1 | 1 | 0 | 0 | 0 | 1 | 1 | 1 | 0 | 0 | 0 | 0 | 1 | 1 | 0 | 0 | 1 | 0 | 0 |
| S3 | 0 | 0 | 0 | 0 | 1 | 1 | 1 | 1 | 1 | 1 | 1 | 1 | 0 | 0 | 0 | 0 | 0 | 0 | 0 | 1 | 0 |
| S4 | 0 | 0 | 0 | 0 | 0 | 0 | 0 | 0 | 0 | 0 | 1 | 1 | 1 | 1 | 1 | 1 | 0 | 0 | 0 | 0 | 1 |

FIG.10

| | D00 | D01 | D02 | D03 | D04 | D05 | D06 | D07 | D08 | D09 | D10 | D11 | D12 | D13 | D14 | D15 |
|---|---|---|---|---|---|---|---|---|---|---|---|---|---|---|---|---|
| P0 | 1 | 1 | 0 | 1 | 1 | 0 | 1 | 0 | 1 | 0 | 1 | 1 | 0 | 1 | 0 | 1 |
| P1 | 1 | 0 | 1 | 1 | 1 | 1 | 1 | 0 | 0 | 1 | 0 | 1 | 1 | 0 | 0 | 0 |
| P2 | 0 | 1 | 1 | 1 | 0 | 0 | 0 | 1 | 1 | 1 | 0 | 0 | 0 | 0 | 1 | 1 |
| P3 | 0 | 0 | 0 | 0 | 1 | 1 | 1 | 1 | 1 | 1 | 1 | 1 | 0 | 0 | 0 | 0 |
| P4 | 0 | 0 | 0 | 0 | 0 | 0 | 0 | 0 | 0 | 0 | 1 | 1 | 1 | 1 | 1 | 1 |
| P5 | 1 | 1 | 1 | 1 | 1 | 1 | 1 | 1 | 1 | 1 | 1 | 1 | 1 | 1 | 1 | 1 |

FIG.12

| | D00 | D01 | D02 | D03 | D04 | D05 | D06 | D07 | D08 | D09 | D10 | D11 | D12 | D13 | D14 | D15 | P00 | P01 | P02 | P03 | P04 | P05 |
|---|---|---|---|---|---|---|---|---|---|---|---|---|---|---|---|---|---|---|---|---|---|---|
| S0 | 1 | 1 | 0 | 1 | 1 | 0 | 1 | 0 | 1 | 0 | 1 | 1 | 0 | 1 | 0 | 1 | 1 | 0 | 0 | 0 | 0 | 0 |
| S1 | 1 | 0 | 1 | 1 | 0 | 1 | 1 | 0 | 0 | 1 | 0 | 1 | 1 | 0 | 0 | 0 | 0 | 1 | 0 | 0 | 0 | 0 |
| S2 | 0 | 1 | 1 | 1 | 0 | 0 | 0 | 1 | 1 | 1 | 0 | 0 | 0 | 0 | 1 | 1 | 0 | 0 | 1 | 0 | 0 | 0 |
| S3 | 0 | 0 | 0 | 0 | 1 | 1 | 1 | 1 | 1 | 0 | 1 | 1 | 0 | 0 | 1 | 0 | 0 | 0 | 0 | 1 | 0 | 0 |
| S4 | 0 | 0 | 0 | 0 | 0 | 0 | 0 | 0 | 0 | 1 | 1 | 1 | 1 | 1 | 1 | 1 | 0 | 0 | 0 | 0 | 1 | 0 |
| S5 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |

FERROELECTRIC MEMORY DEVICE

CROSS-REFERENCE TO RELATED APPLICATIONS

The present application is based upon and claims the benefit of priority from the prior Japanese Patent Application No. 2013-208503 filed on Oct. 3, 2013, with the Japanese Patent Office, the entire contents of which are incorporated herein by reference.

FIELD

The disclosures herein relate to a ferroelectric memory device and a method of writing to memory.

BACKGROUND

Ferroelectric memories employ ferroelectric capacitors as memory cells to retain information during the time the power is off. In ferroelectric memories, writing is performed by polarizing a ferroelectric capacitor upon applying positive or negative voltage thereto. Reading is performed by detecting the presence or absence of polarization inversion current observed upon applying positive voltage to the ferroelectric capacitor.

FIG. 1 is a drawing illustrating an example of the configuration of a memory cell of a ferroelectric memory. The memory cell illustrated in FIG. 1 includes a cell selection transistor 10, a ferroelectric capacitor 11, a word line WL, a bit line BL, and a plate line PL. This memory cell serves to store one-bit information by use of one transistor and one capacitor, and is referred to as a 1T1C-type memory cell.

In a write operation, the word line WL is placed in a selected state (HIGH), thereby turning on the cell selection transistor 10. Upon positive or negative voltage being applied between the bit line BL and the plate line PL, such voltage is applied to the ferroelectric capacitor 11, thereby writing desired data. In the case of writing "0" data, the bit line BL is set to LOW, and the plate line PL is set to HIGH. In the case of writing "1" data, the bit line BL is set to HIGH, and the plate line PL is set to LOW. Even after removal of the applied voltage upon completion of the write operation, polarization of the ferroelectric capacitor remains so that the written data is retained as nonvolatile data.

In a read operation, the word line WL is selected to turn on the cell selection transistor 10, and the plate line PL is set to HIGH. The bit line BL is kept to LOW, so that positive voltage is applied to the ferroelectric capacitor 11. In the case of "0" being stored in the ferroelectric capacitor 11, no polarization inversion occurs because the voltage applied to the ferroelectric capacitor 11 has the same polarization as during the write operation. As a result, a relatively small amount of electric charge flows into the bit line BL. In the case of "1" being stored in the ferroelectric capacitor 11, polarization inversion occurs because the voltage applied to the ferroelectric capacitor has the opposite polarization to the voltage applied during the write operation. As a result, a large amount of electric charge flows into the bit line BL. A sense amplifier senses this current to detect data.

FIG. 2 is a drawing illustrating the signal waveforms of the ferroelectric memory cell illustrated in FIG. 1. The read operation of a ferroelectric memory is a destructive read operation that destroys the stored data. In the ferroelectric memory, a read operation is first performed regardless of whether a read operation or a write operation is intended to be performed.

As illustrated in FIG. 2, the word line WL is set to HIGH to make conductive the cell selection transistor 10 illustrated in FIG. 1. Subsequently, the plate line PL is raised to HIGH, thereby causing the electric charge of the ferroelectric capacitor 11 to be output to the bit line BL. After this read operation, a write operation is performed.

In the write operation, the plate line PL is lowered to LOW. In order to write "0", thereafter, the bit line BL and the plate line PL are both maintained at LOW. In order to write "1", the plate line PL is maintained at LOW while the bit line BL is changed to HIGH. After this, in the case of a RTZ-method ferroelectric memory, the bit line BL is lowered to LOW at the time of completing the write operation.

A change from HIGH to LOW in the bit line BL for the purpose of writing "1" results in the potential of the plate line PL being temporarily lowered by being pulled down by the bit line BL because of the capacitive coupling provided by the ferroelectric capacitor 11 between the plate line PL and the bit line BL. As a result, an undershoot waveform 15 as illustrated in FIG. 2 appears in the plate line PL.

In a memory array, the word line WL and the plate line PL are generally connected to a plurality of ferroelectric memory cells arranged in a single row. Among the ferroelectric capacitors 11 connected to the same plate line PL, a large number of ferroelectric capacitors 11 may have data "1" written therein. In such a case, a large potential drop due to undershooting is observed with respect to the plate line PL. Consequently, a disturb phenomenon occurs in which the amount of polarization is reduced in the ferroelectric capacitors 11 having "0" written therein and connected to the plate line PL of interest. As a result, the reliability of the ferroelectric memory is undermined.

FIGS. 3A through 3C are drawings illustrating the mechanism by which a ferroelectric capacitor having "0" written therein suffers disturbance.

A ferroelectric capacitor having "0" written therein is placed in the state in which no voltage is applied. In such a state, the ferroelectric capacitor has a polarization state indicated by the position of a polarization state 16 on the curves indicative of hysteresis characteristics illustrated in FIG. 3A. Thereafter, a write operation to write "1" to another ferroelectric capacitor that shares the same plate line PL comes to an end, which results in an undershoot being generated on the plate line PL. Due to this undershooting, the voltage state changes toward a state in which applied voltage is negative, i.e., moves toward the left-hand side in FIG. 3A. Consequently, the polarization state of the ferroelectric capacitor having "0" written therein moves to the position of a polarization state 17 illustrated in FIG. 3B. Upon the plate line PL returning to its original potential, the polarization state changes in accordance with the minor loop characteristics of the hysteresis of the ferroelectric capacitor. The polarization state of the ferroelectric capacitor having "0" written therein thus ends up moving to the position of a polarization state 18 illustrated in FIG. 3C. In this manner, the amount of polarization of data "0" decreases as indicated by the position of the polarization state 18 compared with the original polarization state 16.

[Patent Document 1] Japanese Laid-open Patent Publication No. 2005-135488

[Patent Document 2] Japanese Laid-open Patent Publication No. 2007-80343

[Patent Document 3] Japanese Laid-open Patent Publication No. 2009-64440

[Patent Document 4] Japanese Laid-open Patent Publication No. 2004-227686

SUMMARY

According to an aspect of the embodiment, a ferroelectric memory device includes a memory array including a plurality of ferroelectric memory cells, a code generating circuit configured to multiply write data and a parity generator matrix to generate check bits, thereby producing a Hamming code having information bits and the check bits arranged therein, the information bits being the write data, and a driver circuit configured to write the Hamming code to the memory array, wherein the parity generator matrix has a plurality of rows, and a number of "1"s in each of the rows is an even number.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIGS. 3A through 3C are drawings illustrating the mechanism by which a ferroelectric capacitor having "0" written therein suffers disturbance;

FIGS. 6A and 6B are drawings illustrating examples of parity generator matrices used in a code generating circuit;

FIG. 8 is a drawing illustrating an example of a check matrix used in a check-&-error-correction circuit;

FIG. 10 is a drawing illustrating an example of the parity generator matrix for the extended Hamming code;

FIG. 12 is a drawing illustrating an example of a check matrix used in the check-&-error-correction circuit in the case of the extended Hamming code being used;

DESCRIPTION OF EMBODIMENTS

In the following, embodiments of the invention will be described with reference to the accompanying drawings.

Figure 4:
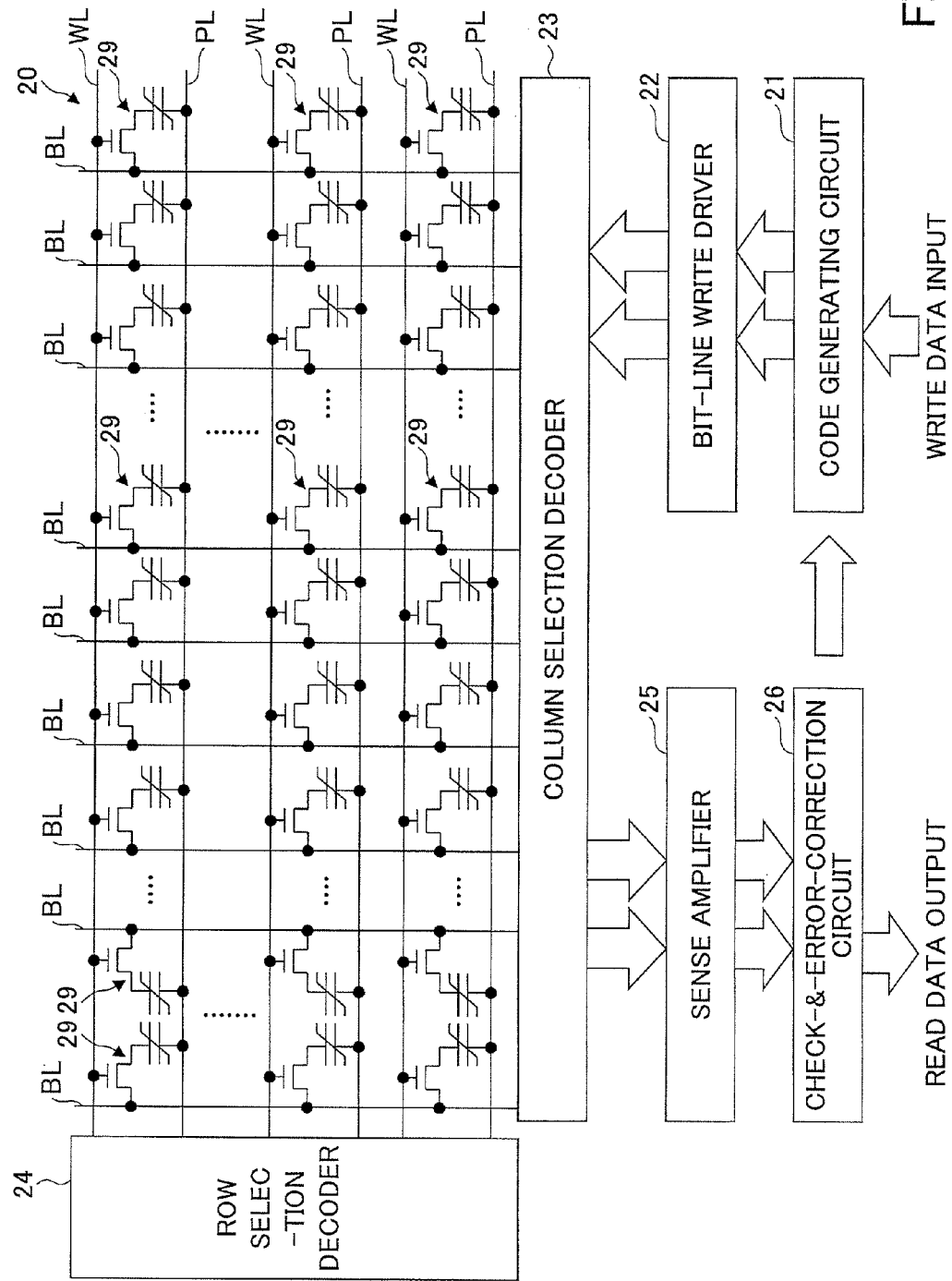
FIG. 4 is a drawing illustrating an example of the configuration of a ferroelectric memory device.

FIG. 4 is a drawing illustrating an example of the configuration of a ferroelectric memory device. The ferroelectric memory device illustrated in FIG. 4 includes a memory array 20, a code generating circuit 21, a bit-line write driver 22, a column selection decoder 23, a row selection decoder 24, a sense amplifier 25, and a check-&-error-correction circuit 26. In FIG. 4 and the subsequent drawings, boundaries between functional or circuit blocks illustrated as boxes basically indicate functional boundaries, and may not correspond to separation in terms of physical positions, separation in terms of electrical signals, separation in terms of control logic, etc. Each functional or circuit block may be a hardware module that is physically separated from other blocks to some extent, or may indicate a function in a hardware module in which this and other blocks are physically combined together.

Figure 1:
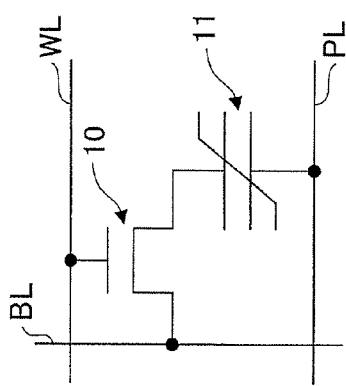
FIG. 1 is a drawing illustrating an example of the configuration of a memory cell of a ferroelectric memory.

The memory array 20 includes a plurality of ferroelectric memory cells 29. The ferroelectric memory cells 29 are arranged in rows and columns in a matrix form. The ferroelectric memory cells 29 arranged horizontally in a row are connected to the same word line WL and the same plate line PL. The ferroelectric memory cells 29 arranged vertically in a column are connected to the same bit line BL. The row selection decoder 24 selectively drives one of the word lines WL and one of the plate lines PL. The bit lines BL are connected to the column selection decoder 23. Each of the ferroelectric memory cells 29 has the configuration illustrated in FIG. 1. Namely, each of the ferroelectric memory cells 29 includes the cell selection transistor 10 and the ferroelectric capacitor 11, and the gate node of the cell selection transistor 10 is connected to the corresponding word line WL, with one end of the ferroelectric capacitor 11 being connected to the corresponding plate line PL. The other end of the ferroelectric capacitor 11 is connected to one end of the channel of the cell selection transistor 10, and the other end of the channel of the cell selection transistor 10 is connected to the corresponding bit line BL. The ferroelectric memory cells 29 of the memory array 20 are of the 1T1C type.

Figure 2:
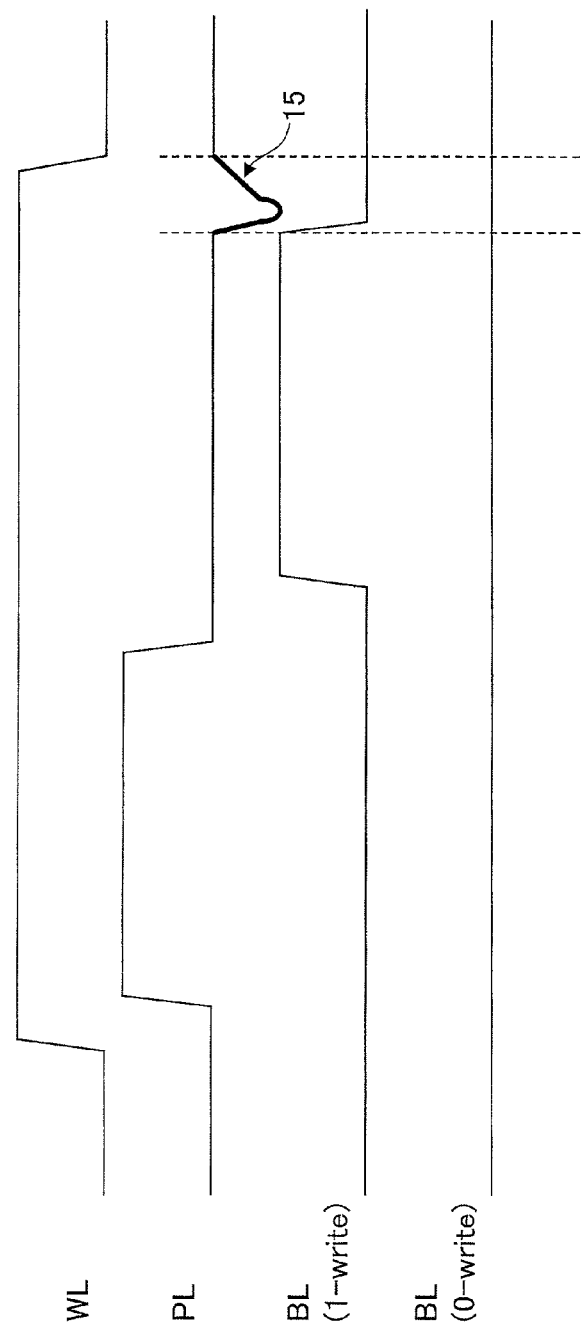
FIG. 2 is a drawing illustrating the signal waveforms of the ferroelectric memory cell illustrated in FIG. 1.

The row selection decoder 24 selectively activates one of the word lines WL in response to a row address, so that the ferroelectric capacitors 11 of the ferroelectric memory cells 29 connected to the activated word line WL are coupled to the bit lines BL. The column selection decoder 23 supplies write data to the bit lines BL corresponding to the write column address, so that the write data is written to the ferroelectric capacitors 11 situated at the write column address. The ferroelectric capacitors 11 corresponding to other column addresses different from the write column address may have the data retrieved therefrom rewritten thereto. Read operations and write operations with respect to the ferroelectric memory cells 29 are performed in accordance with the signal waveforms illustrated in FIG. 2.

The code generating circuit 21 receives write data from outside the ferroelectric memory device. The code generating circuit 21 multiplies the write data and a parity generator matrix to generate check bits, thereby producing a Hamming code having information bits and the check bits arranged therein, with the information bits serving as the write data. In the Hamming code, 4 bits are needed as check bits for information bits of 8-bit width, 5 bits needed as check bits for information bits of 16-bit width, 6 bits needed as check bits for information bits of 32-bit width, and 7 bits needed as check bits for information bits of 64-bit width.

In the case of the number of bits of write data (i.e., the number of information bits) being 16, for example, a parity generator matrix having 5 rows and 16 columns is used. This parity generator matrix and a 16-bit-length column vector are multiplied to generate 5 check bits. The following description will be provided with respect to an example in which the number of information bits is 16, and the number of check bits is 5. The number of information bits and the number of check bits are not limited to those of this example.

As will be described later, each row of the parity generator matrix used in the code generating circuit 21 has an even number of "1"s in the row. Namely, each vector that is used to calculate an inner product with information bits (i.e., to calculate the sum of products using logical products in the product calculation and an exclusive logical sum in the sum calculation) has an even number of vector elements having a value of "1".

The bit-line write driver 22 writes the Hamming code generated by the code generating circuit 21 to the memory array 20. In so doing, the data write operation is performed with respect to the ferroelectric memory cells 29 that are selected by the column selection decoder 23 as corresponding to the write column address. As for the row address, the row selection decoder 24 selectively activates one of the word lines WL and one of the plate lines PL corresponding to the write row address, so that the data write operation is performed with respect to the ferroelectric memory cells 29 situated at this row address.

In the case of a data write operation, data is read from the ferroelectric memory cells 29 selected by the column selection decoder 23 at the read column address, and is then supplied to the sense amplifier 25. To be more specific, voltages responsive to the amounts of electric charge flown into the bit lines BL from the ferroelectric capacitors 11 corresponding to the read column address are applied to the sense amplifier 25. The sense amplifier 25 detects the data read from the memory array 20. Namely, the sense amplifier 25 determines whether each bit of the read data is "0" or "1" by checking the voltages responsive to the amounts of charge flown into the bit lines BL from the ferroelectric capacitor 11. The read data includes 16 information bits and 5 check bits.

The check-&-error-correction circuit 26 checks and corrects an error in the read data based on the 16 information bits and the 5 check bits. Specifically, the check-&-error-correction circuit 26 utilizes the same circuit as the code generating circuit 21 to multiply the parity generator matrix and a column vector constituted by the information bits to generate 5 check bits. The check-&-error-correction circuit 26 performs bit-by-bit comparisons between the 5 generated check bits and the 5 read check bits to generate a 5-bit syndrome. Among the 5 bits of the syndrome, each bit for which the two compared bits have the same value is set to "0", and each bit for which the two compared bits have different values is set to "1". This syndrome is used to identify the error position. The check-&-error-correction circuit 26 reverses the bit value at the position at which the error is identified, thereby outputting the 16 corrected information bits as read data. The read data is output from the ferroelectric memory device. It may be noted that if the Hamming code is used for error correction, for example, error correction is possible if one-bit error occurs in the code, while only error detection is possible if two-bit error occurs.

Figure 5:
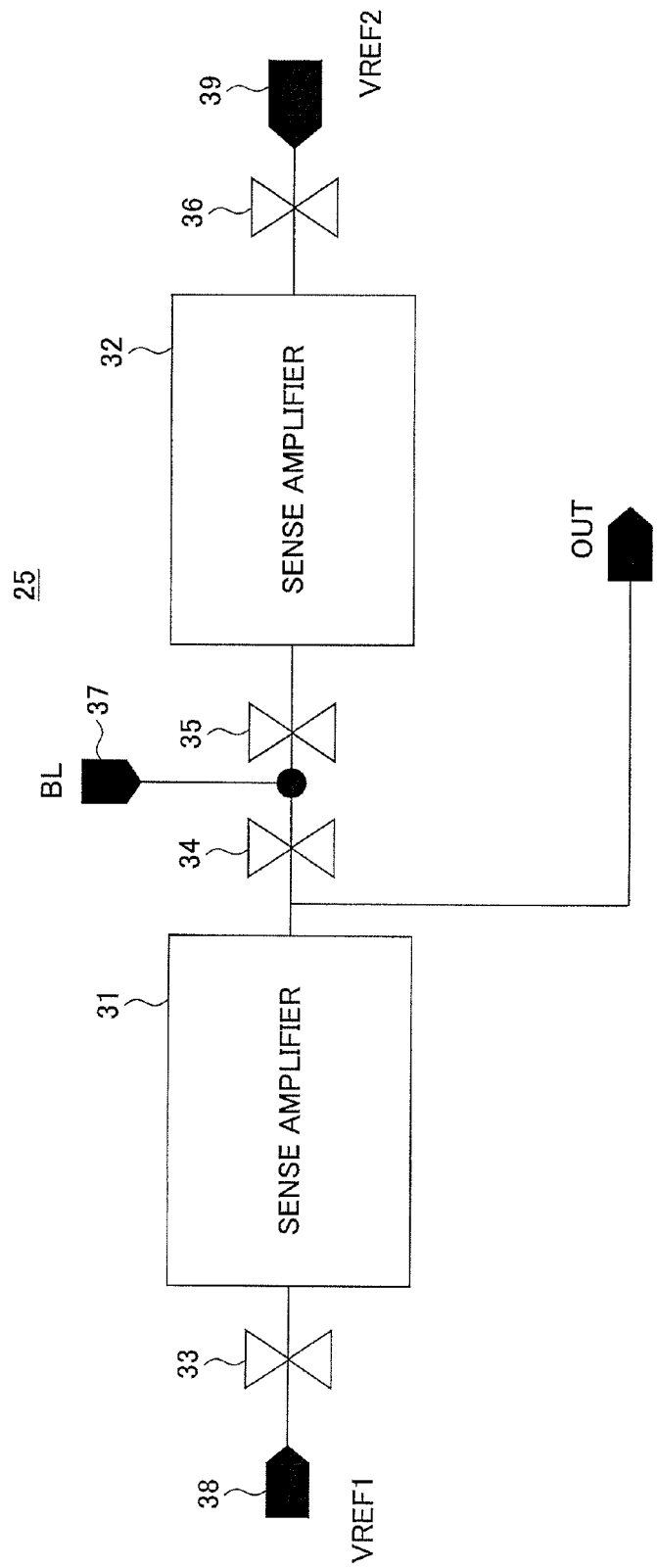
FIG. 5 is a drawing illustrating an example of the configuration of a sense amplifier.

FIG. 5 is a drawing illustrating an example of the configuration of the sense amplifier 25. The sense amplifier 25 illustrated in FIG. 5 includes a first sense amplifier 31, a second sense amplifier 32, and transfer gates 33 through 36. A terminal 37 receives voltage responsive to the amount of electric charge flown into the bit line BL from the ferroelectric memory cell 29. A terminal 38 receives a first reference voltage VREF1 responsive to the amount of electric charge corresponding to the data read from a first reference cell. A terminal 39 receives a second reference voltage VREF2 responsive to the amount of electric charge corresponding to the data read from a second reference cell. The first reference cell and the second reference cell may be two of the ferroelectric memory cells 29 arranged in a matrix form in the memory array 20. In the memory array 20 illustrated in FIG. 4, for example, each of the ferroelectric memory cells 29 connected to the leftmost bit line BL may serve as the first reference cell, and each of the ferroelectric memory cells 29 connected to the second leftmost bit line BL may serve as the second reference cell. Namely, the ferroelectric memory cells 29 that are connected in common to the same one of the word lines WL to be simultaneously read or written may include one first reference cell and one second reference cell.

The first sense amplifier 31 compares the data read from the first reference cell with the read data of the information bit. Namely, the first sense amplifier 31 compares the first reference voltage VREF1 with the read data voltage applied to the terminal 37. The second sense amplifier 32 compares the data read from the second reference cell with the read data of the information bit. Namely, the second sense amplifier 32 compares the second reference voltage VREF2 with the read data voltage applied to the terminal 37. At this time, the transfer gates 33 through 36 are all placed in the conductive state.

Each of the first sense amplifier 31 and the second sense amplifier 32 functions to increase a voltage difference between the two input terminals. The first reference voltage VREF1 may correspond to data "1", and the second reference voltage VREF2 may correspond to data "0". The read data voltage of the information bit may be close to the voltage of data "1". In such a case, the second sense amplifier 32 operates at higher speed while the first sense amplifier 31 operates at lower speed, so that the read data voltage becomes the voltage of data "1". Conversely, the read data voltage of the information bit may be close to the voltage of data "0". In such a case, the first sense amplifier 31 operates at higher speed while the second sense amplifier 32 operates at lower speed, so that the read data voltage becomes the voltage of data "0". In this manner, the sense amplifier 25 may be of a twin-sense-amplifier type, which utilizes the first sense amplifier 31 and the second sense amplifier 32 to detect read data.

In the case of the sense amplifier 25 being of the twin-sense-amplifier type, at least one of the ferroelectric memory cells 29 connected to the same word line WL is a data-"0" reference cell in which "0" is stored. There may be a case in which the information bits and the check bits are all "1"s. In such a case, all the effects of undershooting generated by the plate lines PL of these bits impinges on the reference cell that is the only cell having "0" stored therein. As a result, the reference cell that is the only one cell having "0" stored therein suffers a large disturbance, which results in the sense margin of the sense amplifier being lowered, thereby undermining the reliability of the memory device.

FIGS. 6A and 6B are drawings illustrating examples of parity generator matrices used in the code generating circuit 21. FIG. 6A illustrates an example of a general parity generator matrix, and FIG. 6B illustrates an example of a parity generator matrix used in the code generating circuit 21. The parity generator matrices illustrated in FIGS. 6A and 6B have a size of 5 rows and 15 columns. A column vector having a length of 16 bits is multiplied by such a parity generator matrix to generate 5 check bits. A parity generator matrix is generated by ensuring that the columns D00 through D15 of the matrix have respective, different bit patterns, and that the number of "1"s in each column is 2 or more.

In the case of the parity generator matrix illustrated in FIG. 6A, the number of "1"s in each row is 10 in a row P0, 9 in a row P1, 9 in a row P2, 7 in a row P3, and 5 in a row P4. Namely, the number of "1"s is an odd number in the four rows excluding the row P0. In this case, the use of the 16 write-data information bits that are all "1"s results in the check bits being "01111". Namely, the 16 information bits and the 5 check bits, which are 21 bits in total, include only one bit that is "0". Writing these information bits and check bits to the memory array 20 thus causes the bit having a value of "0" to suffer a large disturbance.

In the case of the check bits being 5, the total number of patterns usable as columns in a parity generator matrix is 26. This is because $2^5$ is equal to 32, and these 32 patterns include 26 patterns having two or more "1"s. Out of these 26 patterns, only 16 patterns are used as columns in a parity generator matrix. Selecting 16 patterns from the 26 patterns in a proper manner serves to adjust the number of "1"s in each row.

In the case of the parity generator matrix illustrated in FIG. 6B, the number of "1"s in each row is 10 in a row P0, 8 in a row P1, 8 in a row P2, in a row P3, and 6 in a row P4. That is, the number of "1"s are an even number in all the rows. In this case, the use of the 16 write-data information bits that are all "1"s results in the check bits being "00000". Namely, the 16 information bits and the 5 check bits, which are 21 bits in total, include 5 bits that are "0". When writing these information bits and check bits to the memory array 20, thus, the amount of disturbance that affects the bits having a value of "0" can be reduced.

Figure 7:
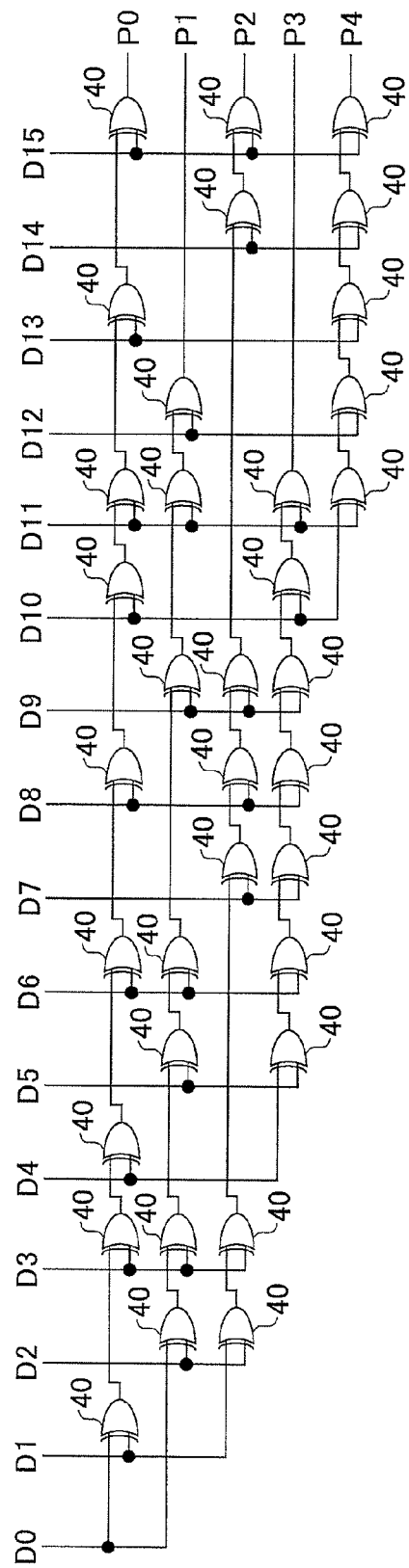
FIG. 7 is a drawing illustrating an example of the configuration of a logic circuit that implements the parity generator matrix illustrated in FIG. 6B.

FIG. 7 is a drawing illustrating an example of the configuration of a logic circuit that implements the parity generator matrix illustrated in FIG. 6B. The code generating circuit 21 utilizes the logic circuit illustrated in FIG. 7 to perform a logic operation that multiplies write data and a parity generator matrix to generate check bits.

The logic circuit illustrated in FIG. 7 includes a plurality of exclusive-OR gates 40. Any given one of the exclusive-OR gates 40 has one input thereof receiving one of the input bits D0 through D15 and the other input thereof receiving another one of the input bits D0 through D15 or the output of another one of the exclusive-OR gates 40. When attention is focused on a given one of the input bits D0 through D15, an exclusive-OR gate 40 that has this bit of interest as an input thereof corresponds to a value of "1" appearing in a corresponding column among the columns D00 through D15 of the parity generator matrix illustrated in FIG. 6B. When attention is focused on the column D05 illustrated in FIG. 6B, for example, the bit pattern of this column is "01010". The second bit from the left in the bit pattern "01010" (i.e., the second bit from the top in FIG. 6B) has a value of "1" at the position of the row P1. A logical product between "1" appearing at the row P1 and at the column D05 and the value of the information bit of the column D05 serves as one of the terms that are added up in the exclusive-OR calculation for generating a check bit P1. Namely, assuming that the values of the other information bits do not change, the value of the check bit P1 calculated in the case of the information bit of the column D05 having a value of "1" is an inverse of the value of the check bit P1 calculated in the case of the information bit of the column D05 having a value of "0". Because of this, in the logic circuit illustrated in FIG. 7, an exclusive-OR gate 40 is provided at the position of the row P1 and at the column of the input bit D5 corresponding to the column D05 of the parity generator matrix. This exclusive-OR gate 40 calculates an exclusive OR operation between the value of D5 and the exclusive OR calculated through D0 through D4. The same or similar rules apply in the case of the other input bits and the other check bits.

FIG. 8 is a drawing illustrating an example of a check matrix used in the check-&-error-correction circuit 26. The check matrix illustrated in FIG. 8 has a size of 5 rows and 21 columns. A column vector having a length of 21 bits is multiplied by this check matrix to generate a 5-bit syndrome. This 21-bit-length column vector includes 5 check bits and 16 information bits that are read from the memory array 20 and detected by the sense amplifier 25. It may be noted that the matrix of 5 rows and 16 columns corresponding to the rows S0 through S4 and the columns D00 through D15 is equal to the parity generator matrix illustrated in FIG. 6B. Namely, multiplication between the parity generator matrix and the column vector constituted by the 16 retrieved information bits is calculated to generate 5 check bits, and these 5 generated check bits are compared with the 5 retrieved check bits on a bit-by-bit basis to generate a syndrome having a length of 5 bits. The calculation that compares the 5 generated check bits and the 5 read check bits on a bit-by-bit basis is performed by multiplying the column vector constituted by the 5 read check bits by the matrix of 5 rows and 5 columns corresponding to the rows S0 through S4 and the columns P00 through P04.

Figure 9:
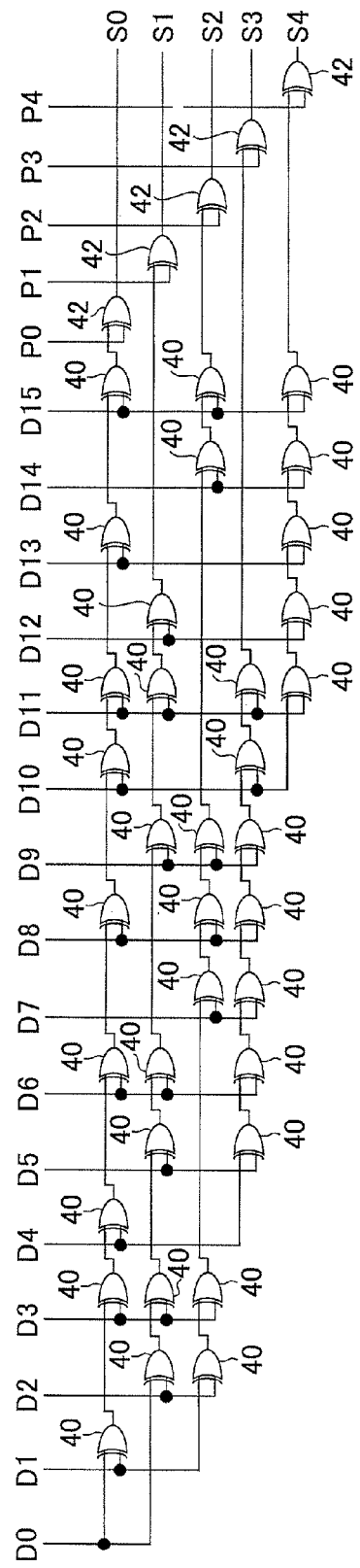
FIG. 9 is a drawing illustrating an example of the configuration of a logic circuit that implements the check matrix illustrated in FIG. 8.

FIG. 9 is a drawing illustrating an example of the configuration of a logic circuit that implements the check matrix illustrated in FIG. 8. The check-&-error-correction circuit 26 utilizes the logic circuit illustrated in FIG. 9 to perform a logic operation multiplying the read data and the check matrix, thereby generating a syndrome.

The logic circuit illustrated in FIG. 9 includes a plurality of exclusive-OR gates 40 and a plurality of exclusive-OR gates 42. The logic circuit portion constituted by the exclusive-OR gates 40 has the same configuration as the logic circuit illustrated in FIG. 7. In the logic circuit illustrated in FIG. 9, the logic circuit portion constituted by the exclusive-OR gates 40 generates 5 check bits, which are compared with the 5 read check bits P0 through P4 on a bit-by-bit basis by the 5 exclusive-OR gates 42 to generate the syndrome S0 through S4. The fact that the two compared bits have the same value results in the corresponding bit of the output syndrome being "0". The fact that the two compared bits have different values results in the corresponding bit of the output syndrome being "1". The fact that the occurrence of a one-bit error generates the syndrome S0 through S4 equal to "01010" means that such a one-bit error has occurred at the position of the column D05 of the check matrix that has the same bit pattern as the bit pattern of this syndrome.

FIG. 10 is a drawing illustrating an example of the parity generator matrix for the extended Hamming code. The parity generator matrix illustrated in FIG. 10 has a size of 6 rows and 16 columns. A column vector having a length of 16 bits is multiplied by such a parity generator matrix to generate 6 check bits. It may be noted that the matrix of 5 rows and 16 columns corresponding to the rows P0 through P4 and the columns D00 through D15 is equal to the parity generator matrix illustrated in FIG. 6B. Five of the 6 generated check bits are the same as the check bits generated by the parity generator matrix illustrated in FIG. 6B. The one remaining check bit is a parity bit obtained by calculating an exclusive-OR value of all the 16 information bits and all the 5 generated check bits.

Figure 11:
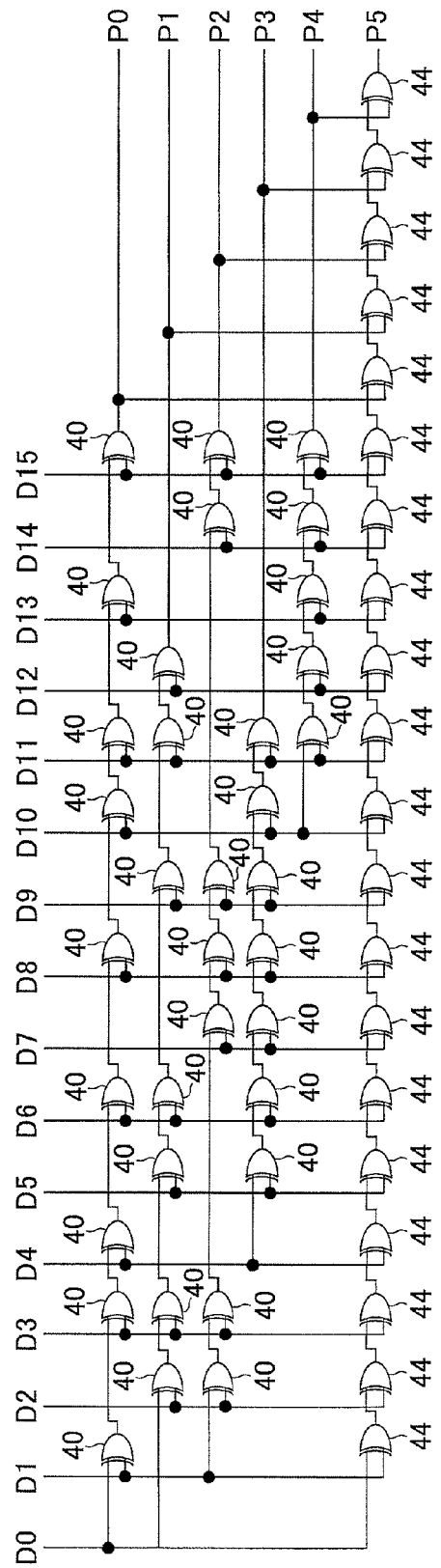
FIG. 11 is a drawing illustrating an example of the configuration of a logic circuit that implements the parity generator matrix illustrated in FIG. 10.

FIG. 11 is a drawing illustrating an example of the configuration of a logic circuit that implements the parity generator matrix illustrated in FIG. 10. The code generating circuit 21 may utilize the logic circuit illustrated in FIG. 11 to perform a logic operation that multiplies write data and a parity generator matrix to generate check bits. In so doing, the code generating circuit 21 may output a parity bit with respect to all the bits of the Hamming code. In this case, the bit-line write driver 22 illustrated in FIG. 4 writes the Hamming code and the parity bit to the memory array 20.

The logic circuit illustrated in FIG. 11 includes a plurality of exclusive-OR gates 40 and a plurality of exclusive-OR gates 44. The logic circuit portion constituted by the exclusive-OR gates 40 has the same configuration as the logic circuit illustrated in FIG. 7. In the logic circuit illustrated in FIG. 11, the logic circuit portion constituted by the exclusive-OR gates 40 generates the 5 check bits P0 through P4. In the logic circuit illustrated in FIG. 11, further, the exclusive-OR gates 44 calculate an exclusive-OR value of all the 16 information bits D0 through D15 and all the 5 generated check bits P0 through P4, thereby generating the check bit P5. The check bit P5 assumes "0" when the number of "1"s in the 16 information bits D0 through D15 and the 5 check bits P0 through P4 is an even number, and assumes "1" when the number of "1"s is an odd number.

FIG. 12 is a drawing illustrating an example of a check matrix used in the check-&-error-correction circuit 26 in the case of the extended Hamming code being used. The check matrix illustrated in FIG. 12 has a size of 6 rows and 22 columns. A column vector having a length of 22 bits is multiplied by this check matrix to generate a G-bit syndrome. This 22-bit-length column vector includes 6 check bits and 16 information bits that are read from the memory array 20 and detected by the sense amplifier 25. It may be noted that the matrix of 5 rows and 16 columns corresponding to the rows S0 through S4 and the columns D00 through D15 is equal to the parity generator matrix illustrated in FIG. 6B. Namely, multiplication between the parity generator matrix and the column vector constituted by the 16 retrieved information bits is calculated to generate 5 check bits, and these 5 generated check bits are compared with the 5 retrieved check bits on a bit-by-bit basis to generate a syndrome S0 through S4 having a length of bits. The calculation that compares the 5 generated check bits and the 5 read check bits on a bit-by-bit basis is performed by multiplying the column vector constituted by the 5 read check bits by the matrix of 5 rows and 5 columns corresponding to the rows S0 through S4 and the columns P00 through P04. The matrix of 1 row and 22 columns corresponding to the row S5 and the columns D00 through P05 is used to calculate an exclusive-OR value of all the 16 retrieved information bits D0 through D15 and all the 6 retrieves check bits P0 through P5 to generate a syndrome S5.

In the case of an error of only one bit being contained in the retrieved information bits and check bits, the syndrome S5 becomes "1". In such a case, the check-&-error-correction circuit 26 can identify the bit position of the one-bit error in response to the bit pattern of the syndrome S0 through S4 to correct the error. In the case of 2 bits of errors being contained in the retrieved information bits and check bits, the syndrome S5 becomes "0", and the syndrome S0 through S4 includes one or more bits that are "1". In this case, the syndrome exhibits a bit pattern that can never occur in the case of a one-bit error. The check-&-error-correction circuit 26 thus sends a notice to outside, without making a check and an error correction.

Figure 13:
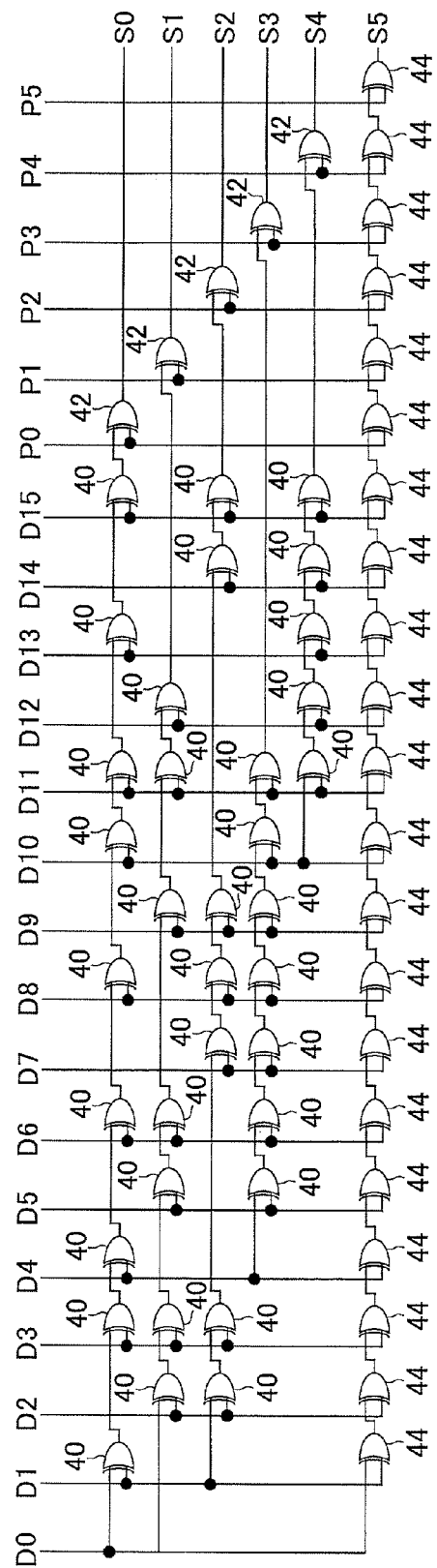
FIG. 13 is a drawing illustrating an example of the configuration of a logic circuit that implements the check matrix illustrated in FIG. 12.

FIG. 13 is a drawing illustrating an example of the configuration of a logic circuit that implements the check matrix illustrated in FIG. 12. The check-&-error-correction circuit 26 utilizes the logic circuit illustrated in FIG. 13 to perform a logic operation multiplying the read data and the check matrix, thereby generating a syndrome.

The logic circuit illustrated in FIG. 13 includes a plurality of exclusive-OR gates 40, a plurality of exclusive-OR gates 42, and a plurality of exclusive-OR gates 44. The logic circuit portion constituted by the exclusive-OR gates 40 has the same configuration as the logic circuit illustrated in FIG. 7. In the logic circuit illustrated in FIG. 13, the logic circuit portion constituted by the exclusive-OR gates 40 generates 5 check bits, which are compared with the 5 read check bits P0 through P4 on a bit-by-bit basis by the 5 exclusive-OR gates 42 to generate the syndrome S0 through S4. The fact that the two compared bits have the same value results in the corresponding bit of the output syndrome being "0". The fact that the two compared bits have different values results in the corresponding bit of the output syndrome being "1".

In the logic circuit illustrated in FIG. 13, further, the exclusive-OR gates 44 calculate an exclusive-OR value of all the 16 retrieved information bits D0 through D15 and all the 6 retrieved check bits P0 through P5, thereby generating the syndrome P5. The syndrome S0 is a parity bit that assumes "0" when the number of "1"s in the 16 information bits D0 through D15 and the 6 check bits P0 through P5 is an even number, and assumes "1" when the number of "1"s is an odd number.

Figure 14:
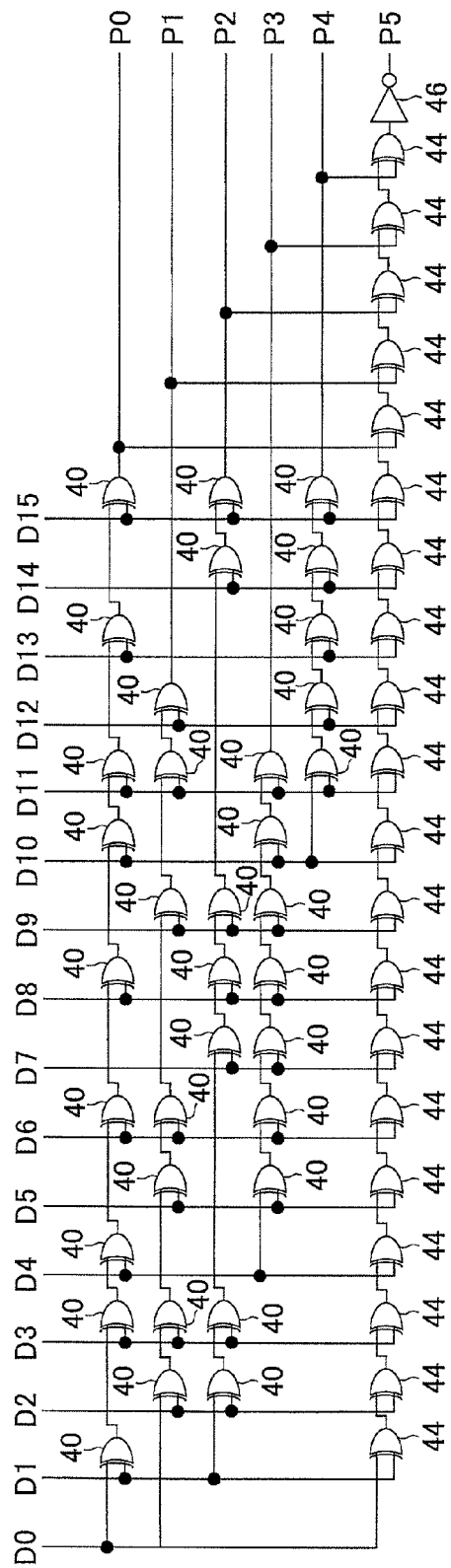
FIG. 14 is a drawing illustrating a variation of the configuration of a logic circuit used in the code generating circuit when the extended Hamming code is employed.

FIG. 14 is a drawing illustrating a variation of the configuration of a logic circuit used in the code generating circuit 21 when the extended Hamming code is employed. In the case of the logic circuit illustrated in FIG. 11, the total number of information bits and check bits excluding the extended parity bit is 21, at least two of which have a value of "0". In the case of two bits having a value of "0", the number of bits having a value of "1" is 19, so that the calculated value of the extended parity bit is "1". As a result, 20 bits are "1" among a total of 22 bits, which means that the amount of imposed disturbance is increased compared with the case in which an extended parity bit is not used (i.e., the case in which the Hamming code is used).

The logic circuit illustrated in FIG. 14 has an inverter 46 as an additional element relative to the logic circuit illustrated in FIG. 11. The inverter 46 inverts the extended parity bit calculated by the logic circuit illustrated in FIG. 11, and the logic circuit illustrated in FIG. 14 outputs this inverted value as the extended parity bit. With this arrangement, in the case of two bits having a value of "0", the number of bits having a value of "1" is 19, so that the calculated value of the extended parity bit is "0". In this case, at least 3 bits are "0" among a total of 22 bits, which means that the amount of disturbance is reduced compared with the case in which the bit value is not inverted as illustrated in FIG. 11.

Figure 15:
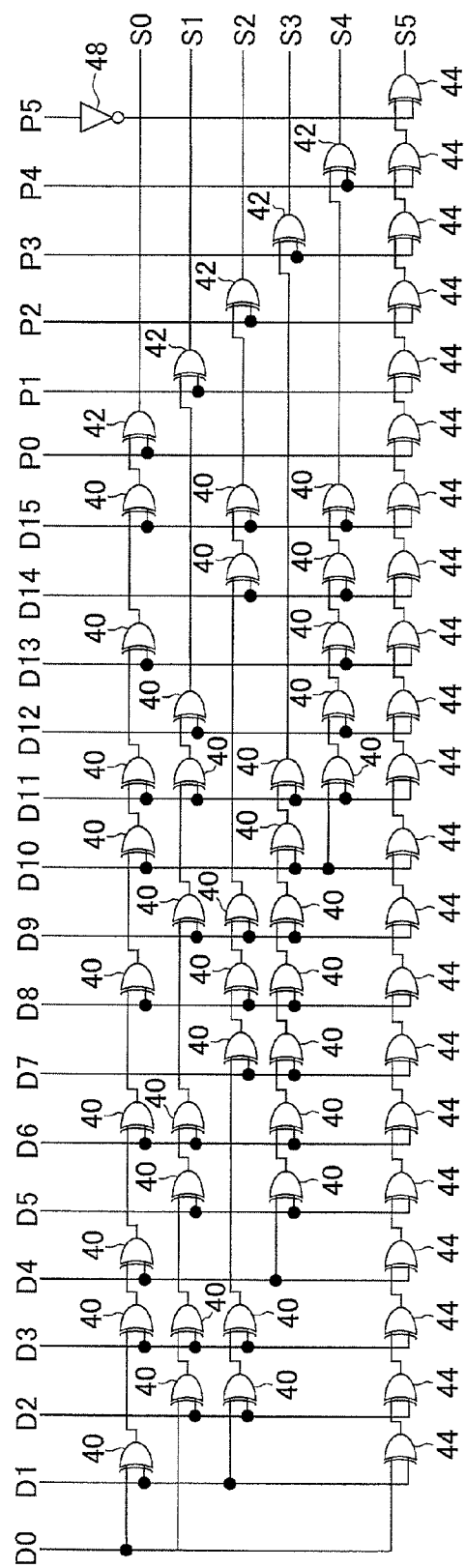
FIG. 15 is a drawing illustrating a variation of the configuration of a logic circuit used in the check-&-error-correction circuit when the extended Hamming code is employed.

FIG. 15 is a drawing illustrating a variation of the configuration of a logic circuit used in the check-&-error-correction circuit 26 when the extended Hamming code is employed. Generating an extended Hamming code (i.e., a Hamming code plus an extended parity bit) by use of the logic circuit illustrated in FIG. 14 results in the parity bit (i.e., the check bit P5) being an inverse of the original bit value. In the logic circuit illustrated in FIG. 13, as was previously described, the exclusive-OR gates 44 calculate an exclusive-OR value of all the 16 retrieved information bits D0 through D15 and all the 6 retrieved check bits P0 through P5, thereby generating the syndrome P5. The logic circuit illustrated in FIG. 15 has an inverter for inverting a logic value of the parity bit retrieved from the memory array as an additional element relative to the logic circuit illustrated in FIG. 13. The inverter 48 inverts the logic value of the retrieved check bit P5. An exclusive-OR value of the inverse of the value of the check bit P5, the 16 information bits D0 through D15, and the 5 remaining check bits P5 through P4 is calculated to generate the syndrome S5. This arrangement allows a correct value of the syndrome S5 to be calculated.

Figure 16:
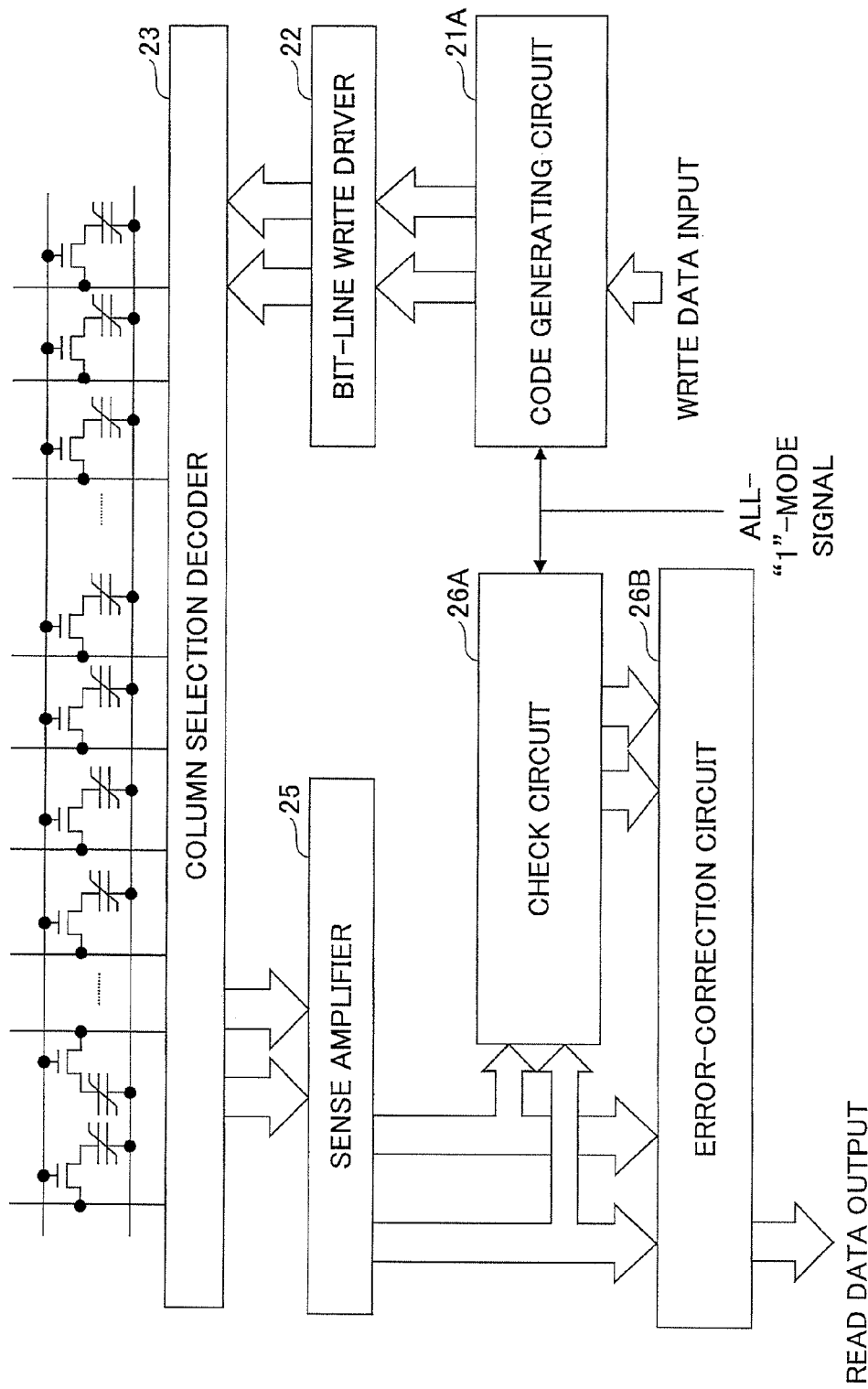
FIG. 16 is a drawing illustrating a variation of the configuration of a ferroelectric memory device.

FIG. 16 is a drawing illustrating a variation of the configuration of a ferroelectric memory device. In FIG. 16, the same or corresponding elements as those of FIG. 4 are referred to by the same or corresponding numerals, and a description thereof will be omitted as appropriate. FIG. 15 illustrates only the portions that are different than in FIG. 4 and the periphery thereof, and the portions that are the same as in FIG. 4 are omitted from illustration.

In the ferroelectric memory device illustrated in FIG. 16, a code generating circuit 21A is provided in place of the code generating circuit 21 illustrated in FIG. 4, and a check circuit 26A and an error-correction circuit 26B are provided in place of the check-&-error-correction circuit 26 illustrated in FIG. 4. Like the code generating circuit 21, the code generating circuit 21A multiplies the write data and a parity generator matrix to generate check bits, thereby producing a Hamming code having information bits and the check bits arranged therein, with the information bits serving as the write data. The check circuit 26A calculates a syndrome based on the information bits and check bits retrieved (i.e., read) from the memory array 20 to make an error correction with respect to the retrieved data. The error-correction circuit 26B reverses the bit value at the position at which the error is found by the use of the syndrome, thereby outputting the corrected information bits as read data. In the ferroelectric memory device illustrated in FIG. 16, an all-"1"-mode signal is asserted in response to instruction from outside the ferroelectric memory device, and is applied to the code generating circuit 21A and the check circuit 26A. This all-"1"-mode signal is asserted in order to set all the bits of information bits and check bits to "1".

Figure 17:
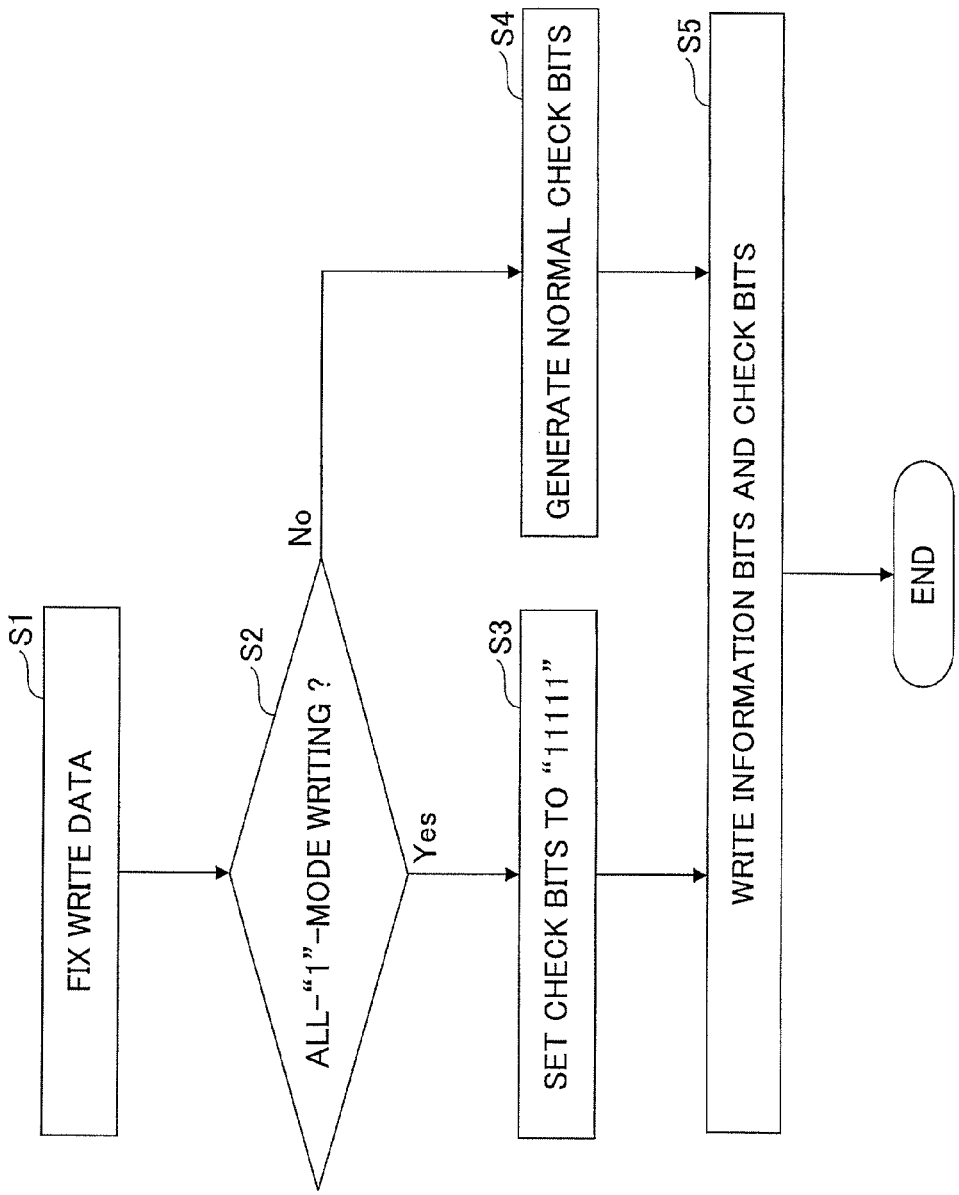
FIG. 17 is a flowchart illustrating an example of the operation performed at the time of writing in the ferroelectric memory device.

FIG. 17 is a flowchart illustrating an example of the operation performed at the time of writing in the ferroelectric memory device. It may be noted that, in FIG. 17 and the subsequent flowcharts, an order in which the steps illustrated in the flowchart are performed is only an example. The scope of the disclosed technology is not limited to the disclosed order. For example, a description may explain that an A step is performed before a B step is performed. Despite such a description, it may be physically and logically possible to perform the B step before the A step while it is possible to perform the A step before the B step. In such a case, all the consequences that affect the outcomes of the flowchart may be the same regardless of which step is performed first. It then follows that, for the purposes of the disclosed technology, it is apparent that the B step can be performed before the A step is performed. Despite the explanation that the A step is performed before the B step, such a description is not intended to place the obvious case as described above outside the scope of the disclosed technology. Such an obvious case inevitably falls within the scope of the technology intended by this disclosure.

In step S1, write data applied to the code generating circuit 21A is fixed. In step S2, the code generating circuit 21A determines whether all-"1"-mode writing is to be performed. Specifically, the code generating circuit 21A determines that all-"1"-mode writing is to be performed in the case of the all-"1"-mode signal being in the asserted state.

If the check in step S2 finds that all-"1"-mode writing is to be performed, the code generating circuit 21A sets all the check bits to "1" in step S3. In the case of the number of check bits being 5, for example, these check bits are set to "11111". In step S5, the information bits and the check bits are written from the code generating circuit 21A to the memory array 20 through the bit-line write driver 22. In so doing, all the bits of the write data supplied from an external source are set to "1"s, so that the information bits and the check bits written to the memory array 20 are all "1"s.

If the check in step S2 finds that all-"1"-mode writing is not to be performed, the code generating circuit 21A generates check bits in an ordinary fashion based on the write data in step S4. Namely, multiplication between the parity generator matrix and the write data is calculated to generate the check bits. In step S5, the information bits and the check bits are written from the code generating circuit 21A to the memory array 20 through the bit-line write driver 22.

Figure 18:
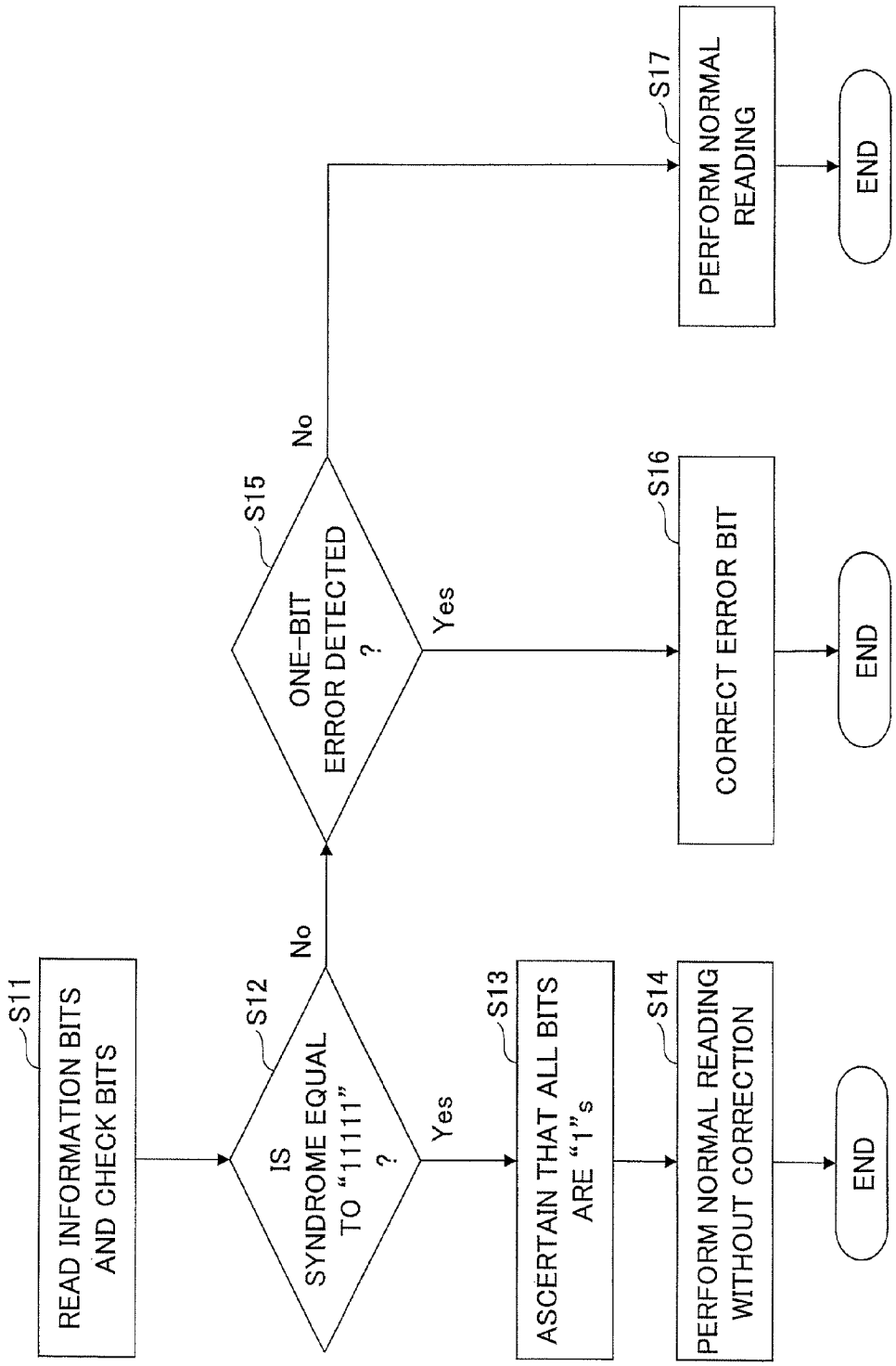
FIG. 18 is a flowchart illustrating an example of the operation performed at the time of reading in the ferroelectric memory device.

FIG. 18 is a flowchart illustrating an example of the operation performed at the time of reading in the ferroelectric memory device. In step S11, information bits and check bits are read from the memory array 20. In step S12, the check circuit 26A calculates a syndrome, and determines whether all the bits of the calculated syndrome are "1"s. In the case of the bit width of the syndrome being 5, for example, a check is made as to whether the syndrome is equal to "11111".

If the check in step S12 finds that all the bits of the syndrome are "1"s, the check circuit 26A determines in step S13 that all the bits are "1"s. In step S14, the error-correction circuit 26B outputs the original information bits as read data without correcting these information bits.

If the check in step S12 finds that at least one of the syndrome bits is not "1", the check circuit 26A checks in step S15 whether a one-bit error has been detected. In the case of a one-bit error having been detected, the error-correction circuit 26B reverses one bit at the bit position indicated by the syndrome, thereby correcting this one bit in step S16. In the case of no one-bit error having been detected, the error-correction circuit 26B outputs as read data the original information bits retrieved from the memory array 20 in step S17.

Figure 19:
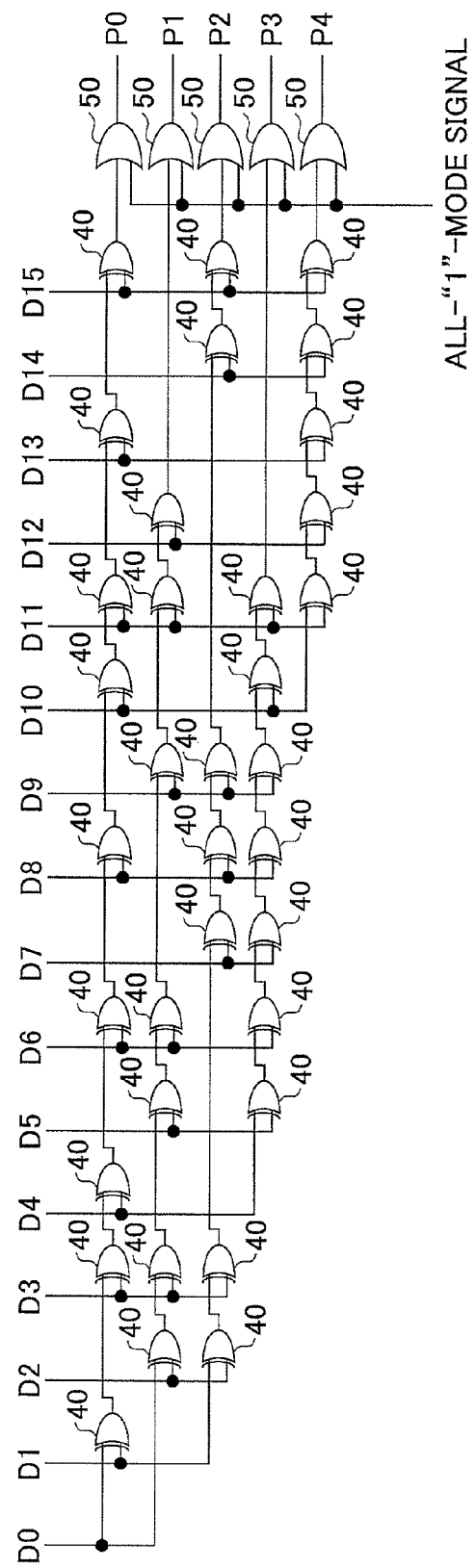
FIG. 19 is a drawing illustrating an example of the configuration of a logic circuit that implements the parity generator matrix used in the code generating circuit.

FIG. 19 is a drawing illustrating an example of the configuration of a logic circuit that implements the parity generator matrix used in the code generating circuit 21A. The code generating circuit 21A may utilize the logic circuit illustrated in FIG. 19 to perform a logic operation that multiplies write data and a parity generator matrix to generate check bits.

The logic circuit illustrated in FIG. 19 includes a plurality of exclusive-OR gates 40 and a plurality of OR gates 50. The logic circuit portion constituted by the exclusive-OR gates 40 has the same configuration as the logic circuit illustrated in FIG. 7. The 5 check bits generated by this circuit portion are supplied to one input of the 5 OR gates 50, respectively. The other input of the 5 OR gates 50 receives the all-"1"-mode signal. The all-"1"-mode signal is placed in the asserted state in order to set all the bits written to the memory array 20 to "1". In the case of the all-"1"-mode signal being set to "1", the check bits P0 through P4 output from the OR gates 50 are set to "1". In this manner, the code generating circuit 21A generates check bits whose logical values are all "1"s.

According to one embodiment, a ferroelectric memory in which disturbance is reduced is provided.

Further, the present invention is not limited to these embodiments, but various variations and modifications may be made without departing from the scope of the present invention.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A ferroelectric memory device, comprising:
   a memory array including a plurality of ferroelectric memory cells;
   a code generating circuit configured to multiply write data and a parity generator matrix to generate check bits, thereby producing a Hamming code having information bits and the check bits arranged therein, the information bits being the write data; and
   a driver circuit configured to write the Hamming code to the memory array,
   wherein the parity generator matrix has a plurality of rows, and a number of "1"s in each of the rows is an even number.

2. The ferroelectric memory device as claimed in claim 1, wherein the ferroelectric memory cells are of a 1T1C type.

3. The ferroelectric memory device as claimed in claim 1, wherein the code generating circuit is configured to further produce a parity bit with respect to all bits of the Hamming code, and the driver circuit is configured to write the Hamming code and the parity bit to the memory array.

4. The ferroelectric memory device as claimed in claim 1, wherein the code generating circuit is configured to further produce a bit whose value is an inverse of a parity bit obtained with respect to all bits of the Hamming code, and the driver circuit is configured to write to the memory array the Hamming code and the bit whose value is an inverse of the parity bit.

5. The ferroelectric memory device as claimed in claim 4, further comprising a circuit configured to invert a logic value of the parity bit read from the memory array.

6. The ferroelectric memory device as claimed in claim 1, wherein the code generating circuit is configured to generate check bits all of which have a logic value of "1" and to produce data having, arranged therein, the information bits and the check bits all of which have a logic value of "1", the information bits being the write data.

7. The ferroelectric memory device as claimed in claim 1, further comprising a sense amplifier configured to detect read data retrieved from the memory array, wherein the memory array includes a plurality of word lines, and the ferroelectric memory cells that are connected to a same one of the plurality of word lines and that are simultaneously read and written include a first reference cell and a second reference cell, and wherein the sense amplifier is of a twin-sense-amplifier type and includes:

a first sense amplifier configured to compare the read data with data read from the first reference cell; and a second sense amplifier configured to compare the read data with data read from the second reference cell.

8. A method of writing a Hamming code to a memory array including a plurality of ferroelectric memory cells, comprising:

calculating multiplication between write data and a parity generator matrix, thereby generating check bits, the parity generator matrix having a plurality of rows in each of which a number of "1"s is an even number; and writing to the memory array a Hamming code having information bits and the check bits arranged therein, the information bits being the write data.

* * * * *